US006489202B1

(12) United States Patent
Hsu et al.

(10) Patent No.: US 6,489,202 B1
(45) Date of Patent: Dec. 3, 2002

(54) STRUCTURE OF AN EMBEDDED CHANNEL WRITE-ERASE FLASH MEMORY CELL AND FABRICATING METHOD THEREOF

(75) Inventors: Ching-Hsiang Hsu, Hsin-Chu (TW); Ching-Sung Yang, Hsin-Chu (TW)

(73) Assignee: eMemory Technology, Inc., Hsin-chu (TW)

( * ) Notice: Subject to any disclaimer, the term of this patent is extended or adjusted under 35 U.S.C. 154(b) by 0 days.

(21) Appl. No.: 09/865,432

(22) Filed: May 29, 2001

(51) Int. Cl.[7] .......................................... H01L 21/8247
(52) U.S. Cl. ...................................... 438/258; 438/264
(58) Field of Search ................................. 438/257–267

(56) References Cited

U.S. PATENT DOCUMENTS 5,538,912 A  *  7/1996  Kunori et al.
6,043,123 A  *  3/2000  Wang et al. ................. 438/258
6,187,635 B1 *  2/2001  Kaya ........................... 438/264

* cited by examiner

Primary Examiner—Richard Booth
(74) Attorney, Agent, or Firm—Winston Hsu (57) ABSTRACT

The present invention relates to a structure of an embedded channel write/erase flash memory cell and a fabricating method thereof and, more particularly, to a structure combining CMOS devices and flash memory cells, wherein flash memory cell structures and CMOS devices are simultaneously fabricated on a substrate to reduce the cost and to simplify the process flow. Moreover, CMOS devices capable of performing high-voltage and low-voltage operations are reserved. Therefore, the present invention can not only effectively improve the operating efficiency of flash memory cells and CMOS devices, but its whole volume is also smaller than that obtained by combining separately designed and fabricated CMOS devices and flash memory cells.

20 Claims, 15 Drawing Sheets

STRUCTURE OF AN EMBEDDED CHANNEL WRITE-ERASE FLASH MEMORY CELL AND FABRICATING METHOD THEREOF

FIELD OF THE INVENTION

The present invention relates to a structure of an embedded channel write/erase flash memory cell and a fabricating method thereof and, more particularly, to a structure combining CMOS devices and flash memory cells, which can not only effectively improve the operating efficiency of flash memory cell and CMOS device, but its whole volume is also smaller than that obtained by combining separately designed and fabricated CMOS devices and flash memory cells.

BACKGROUND OF THE INVENTION

Generally, flash memories and CMOS logical circuits are separately designed and fabricated. Although designers can select and match them according to required circuit designs, the volumes after integrated are unsatisfactorily larger for present demands. Nowadays, most products have been standardized, and mutual collocations of most products have specific modes. Therefore, if an IC combining flash memories and CMOS logical circuits is designed according to most of the specifications, the occupied space can be effectively reduced.

Accordingly, the present invention aims to propose a structure of an embedded channel write/erase flash memory cell and a fabricating method thereof, which can not only effectively improve the operating efficiency of flash memory cells and CMOS devices, but its whole volume is also smaller than that obtained by combining separately designed and fabricated CMOS devices and flash memory cells.

SUMMARY OF THE INVENTION

The primary object of the present invention is to provide a structure of an embedded channel write/erase flash memory cell and a fabricating method thereof, wherein flash memory cell structures and CMOS logical devices are simultaneously fabricated on a substrate so that the flash memory cell structures and the CMOS logical devices can be combined and the whole occupied space can be reduced.

The secondary object of the present invention is to provide a structure of an embedded channel write/erase flash memory cell and a fabricating method thereof, wherein CMOS devices capable of performing high-voltage and low-voltage operations are reserved, hence effectively enhancing the whole operating efficiency.

The various objects and advantages of the present invention will be more readily understood from the following detailed description when read in conjunction with the appended drawings, in which:

DETAILED DESCRIPTION OF THE PREFERRED EMBODIMENTS

Figure 1A:
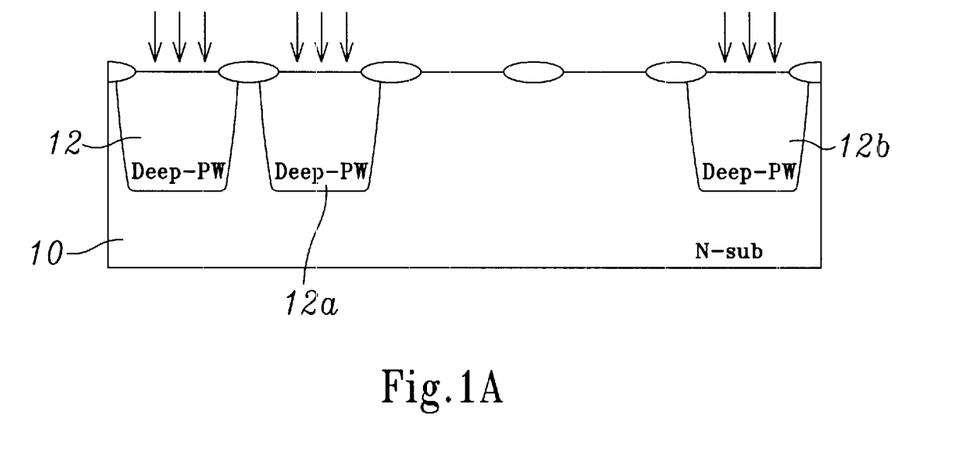
FIG. 1 is a cross-sectional view showing the process flow according to a preferred embodiment of the present invention.
Figure 1B:
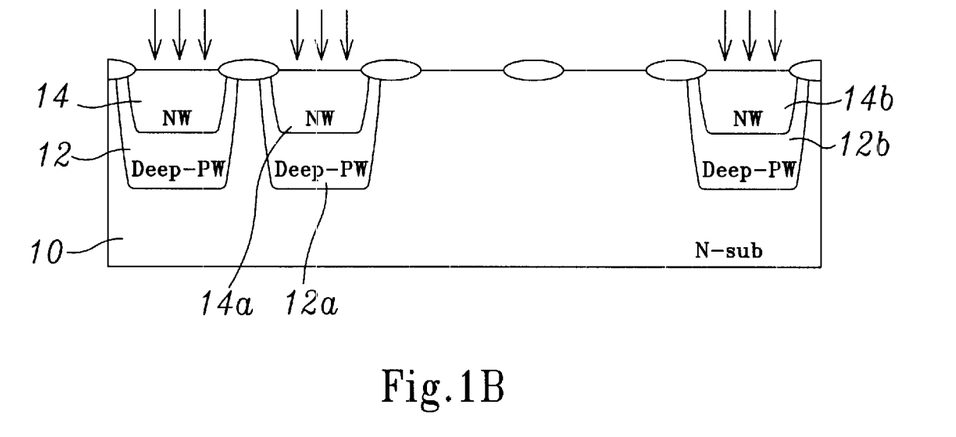
Figure 1C:
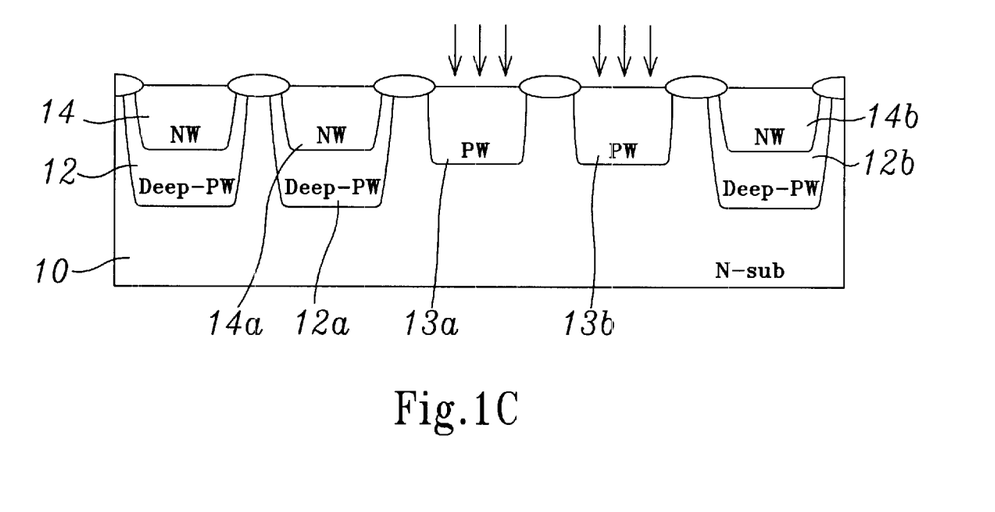
Figure 1D:
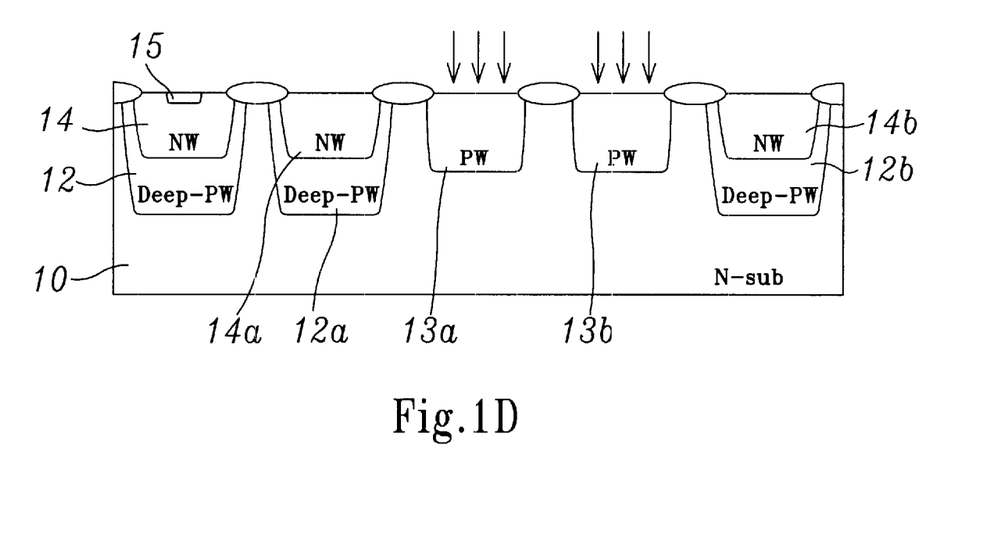
Figure 1E:
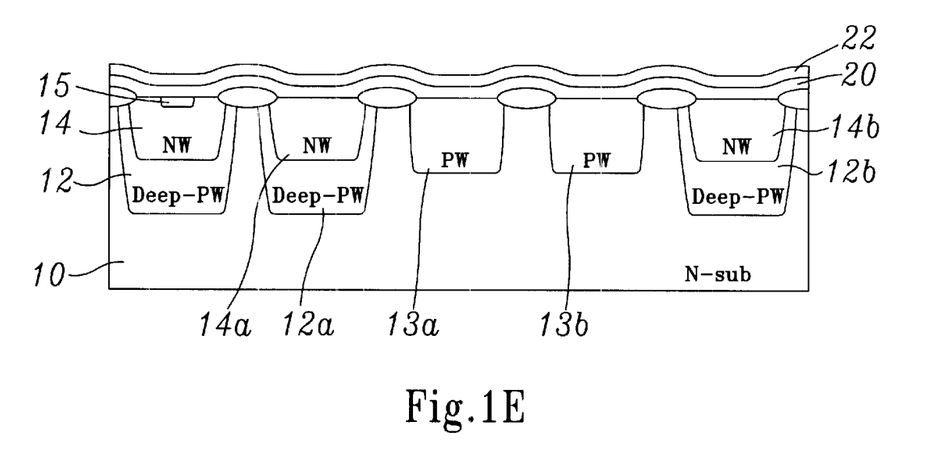
Figure 1F:
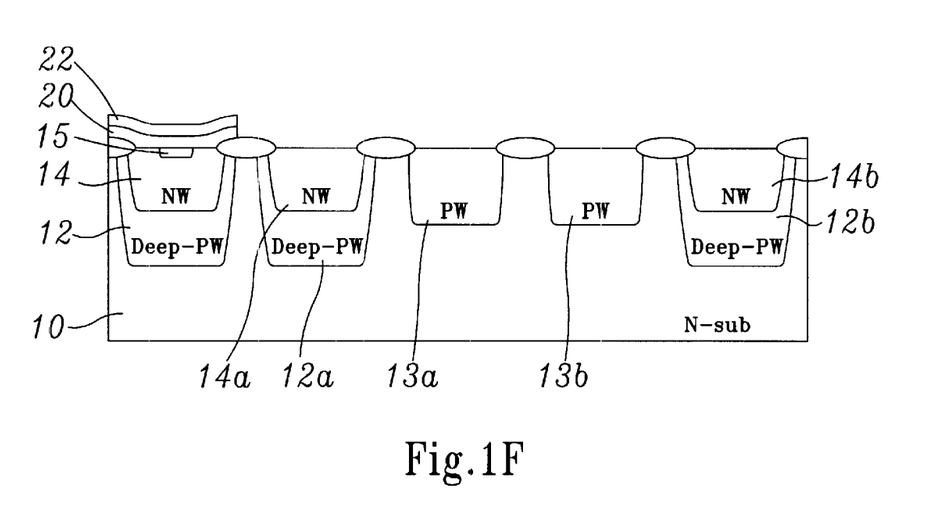
Figure 1G:
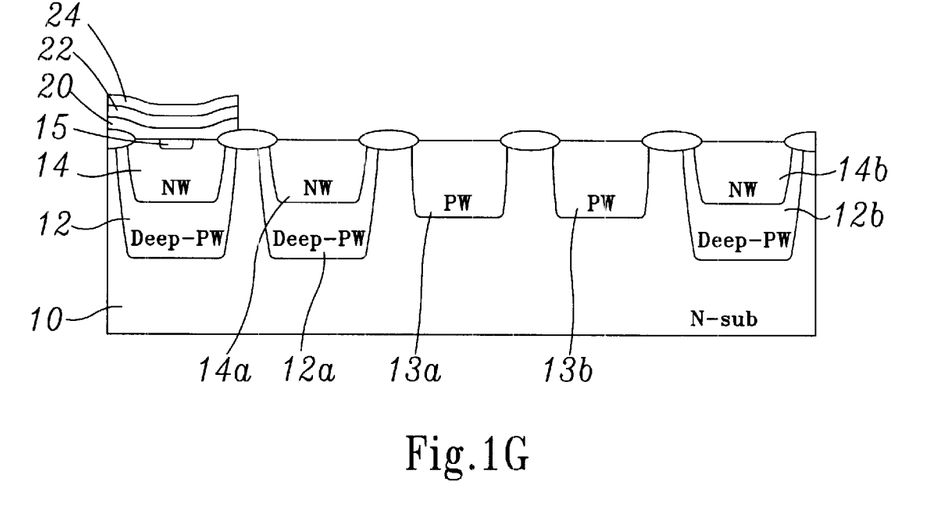
Figure 1H:
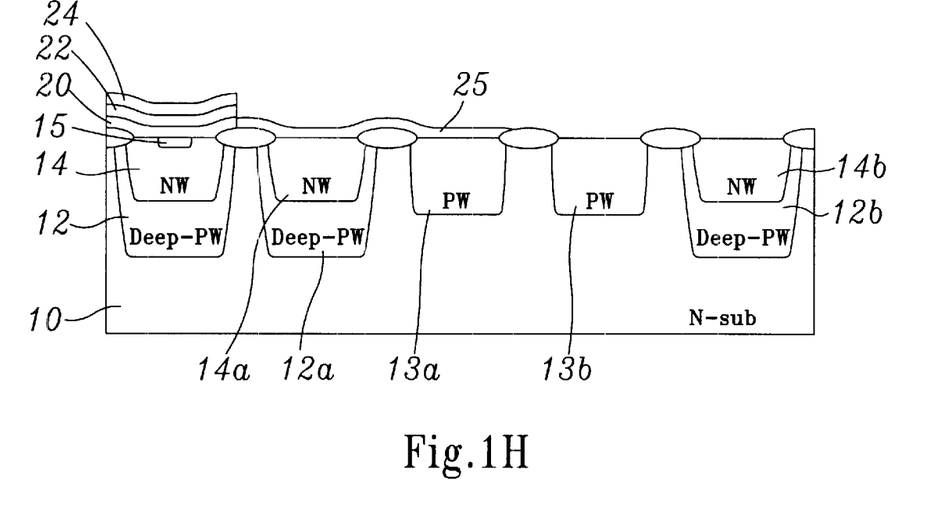
Figure 1I:
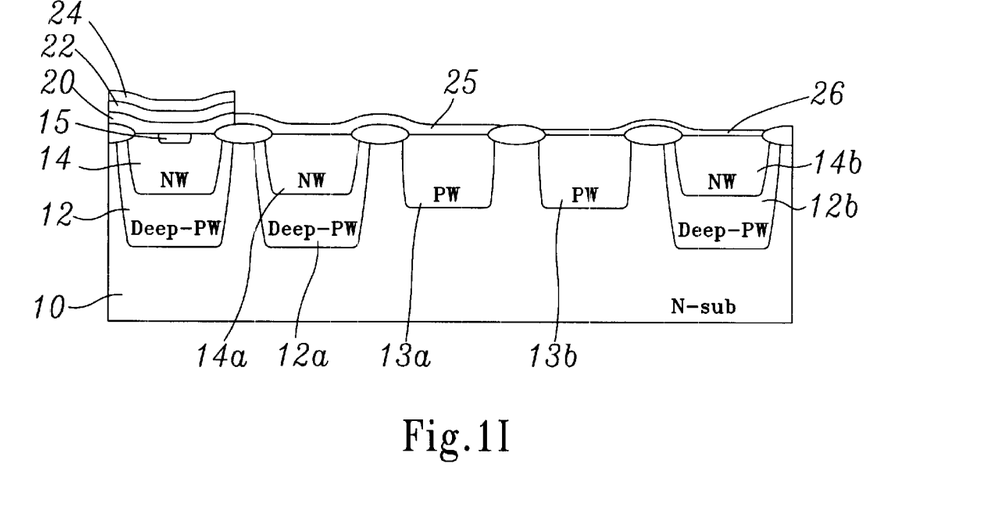
Figure 1J:
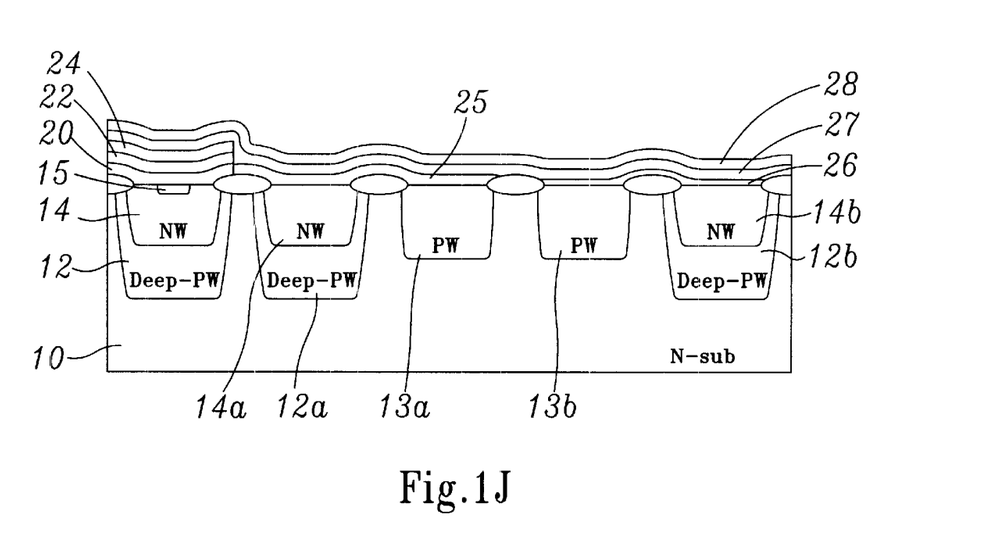
Figure 1K:
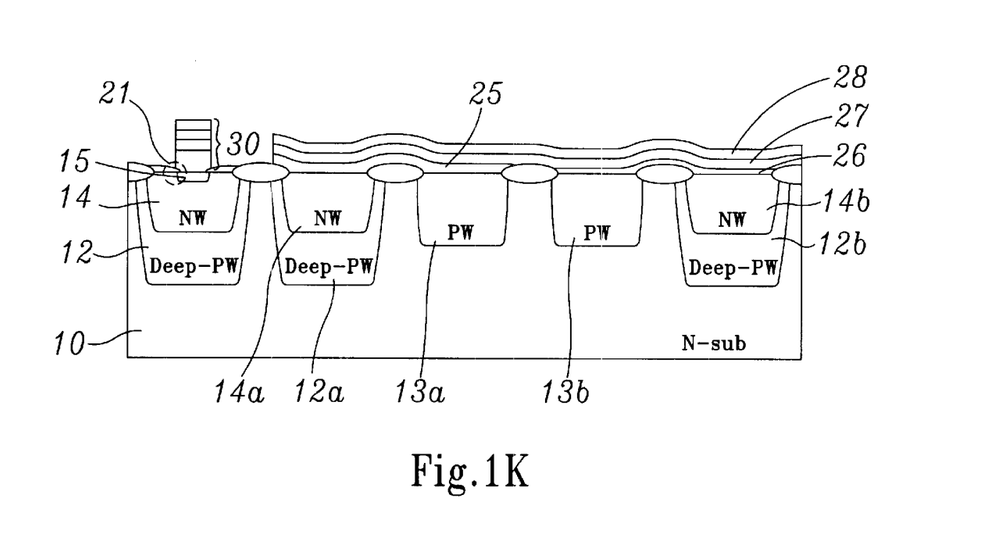
Figure 1L:
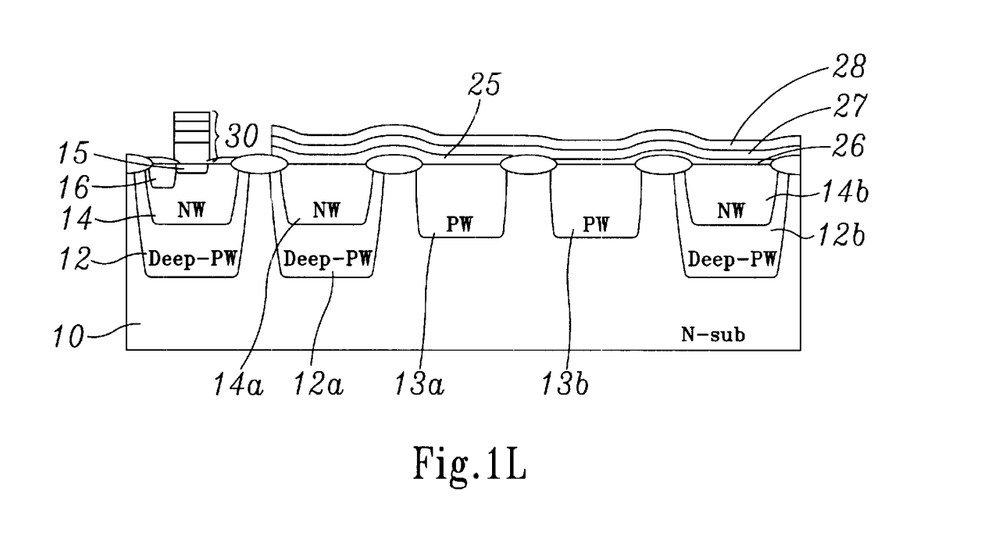
Figure 1M:
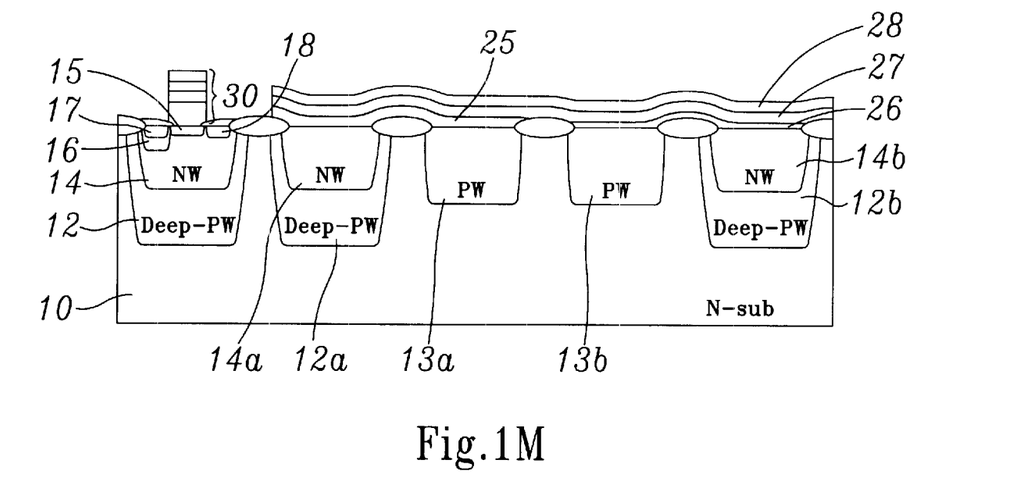
Figure 1N:
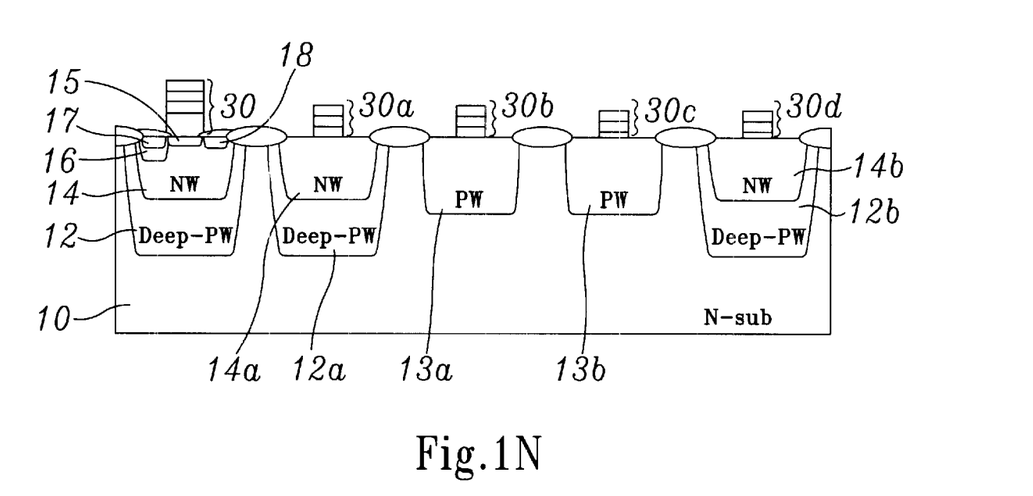
Figure 1P:
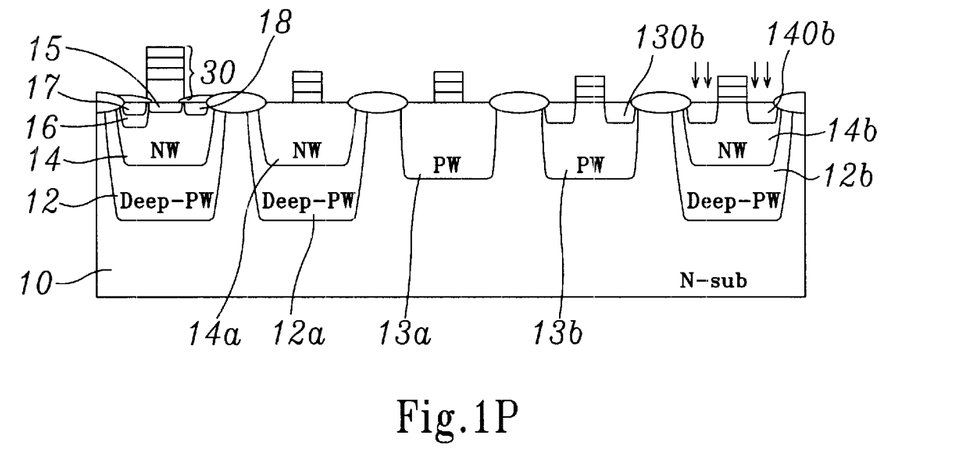
Figure 1Q:
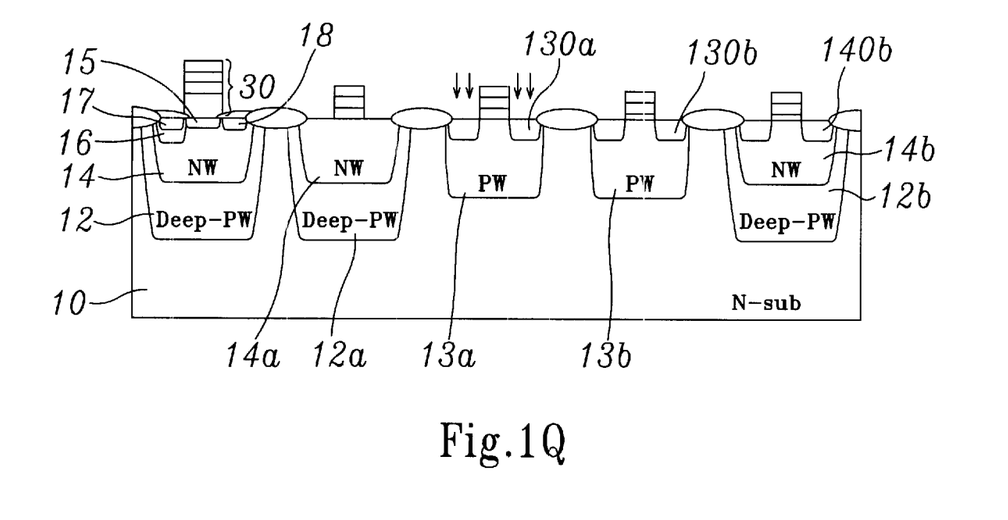
Figure 1R:
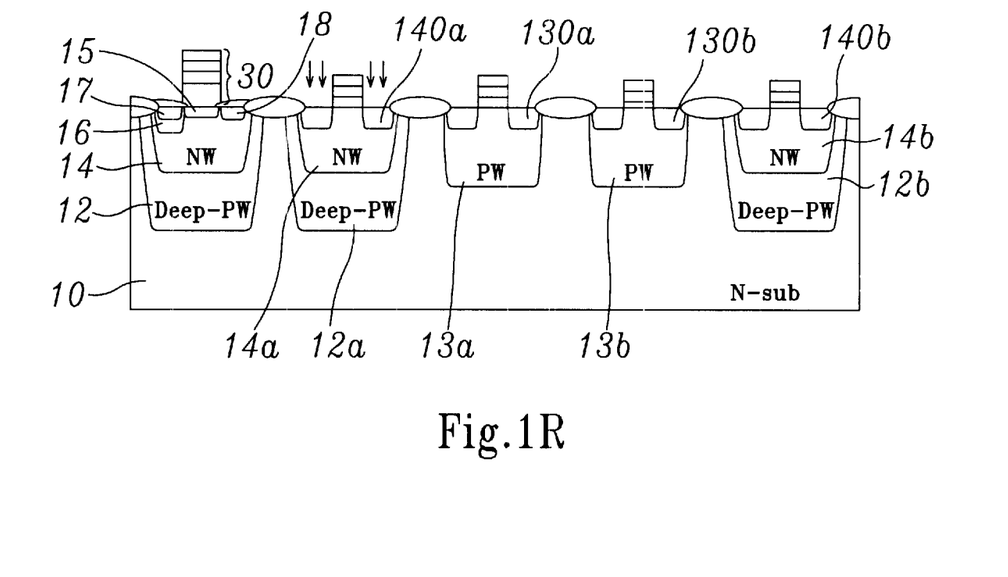
Figure 1S:
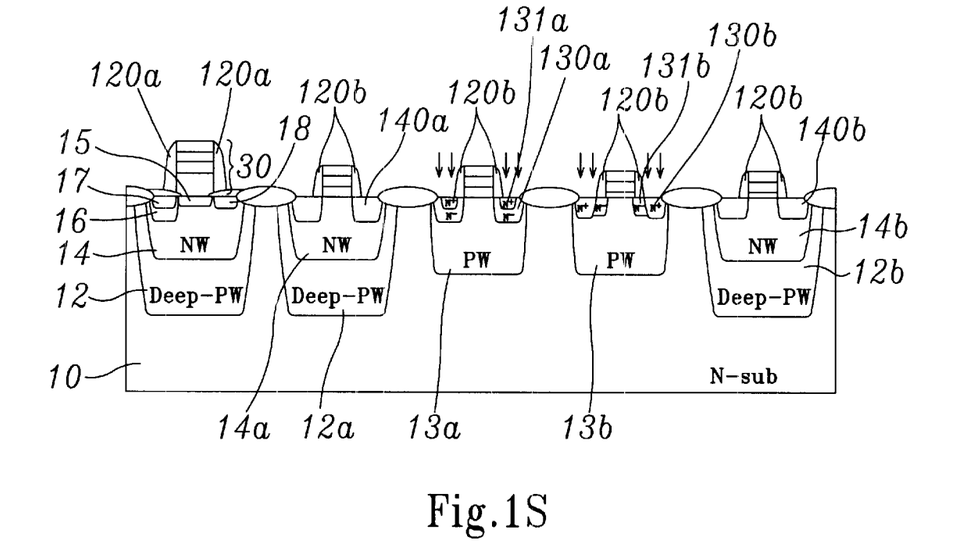
Figure 1T:
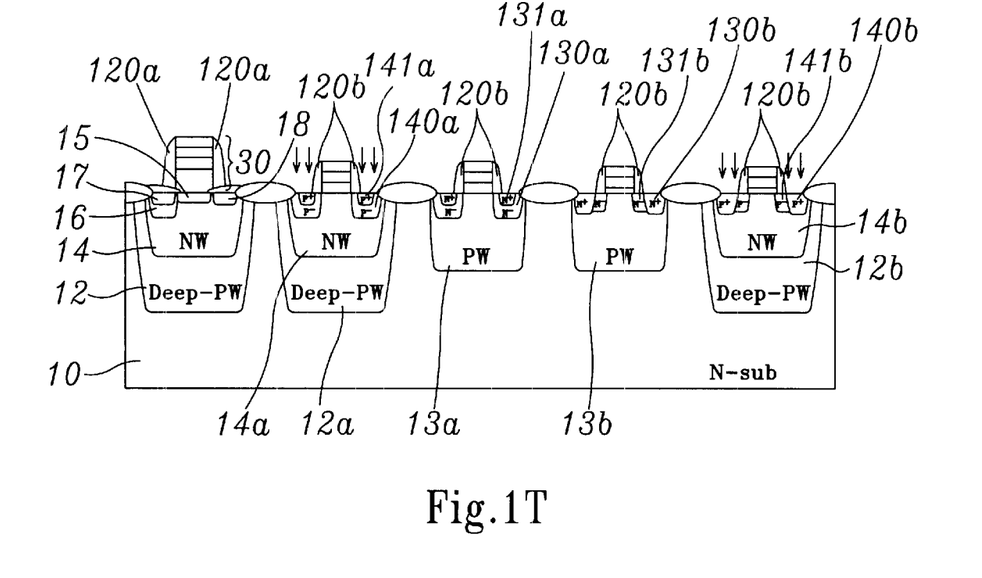
Figure 1U:
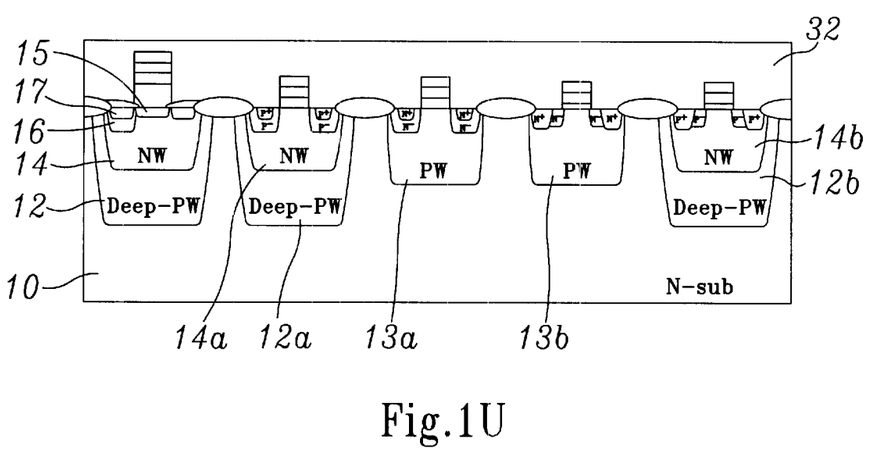
Figure 1V:
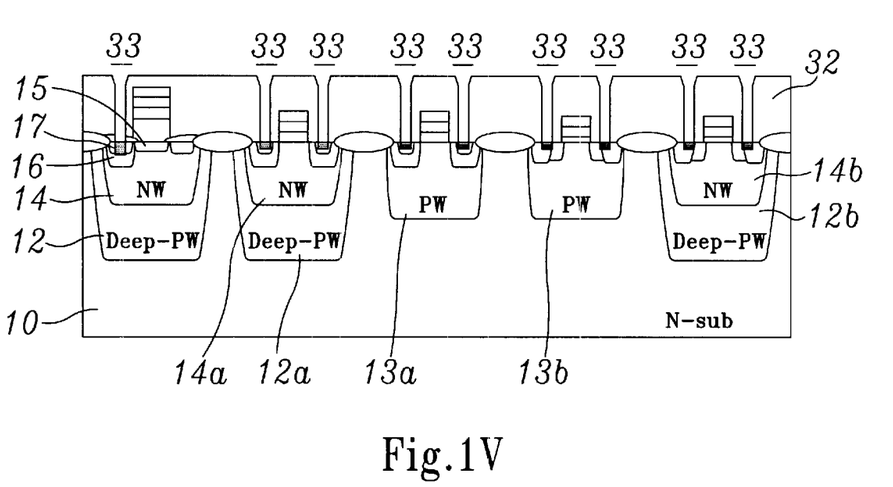
Figure 1W:
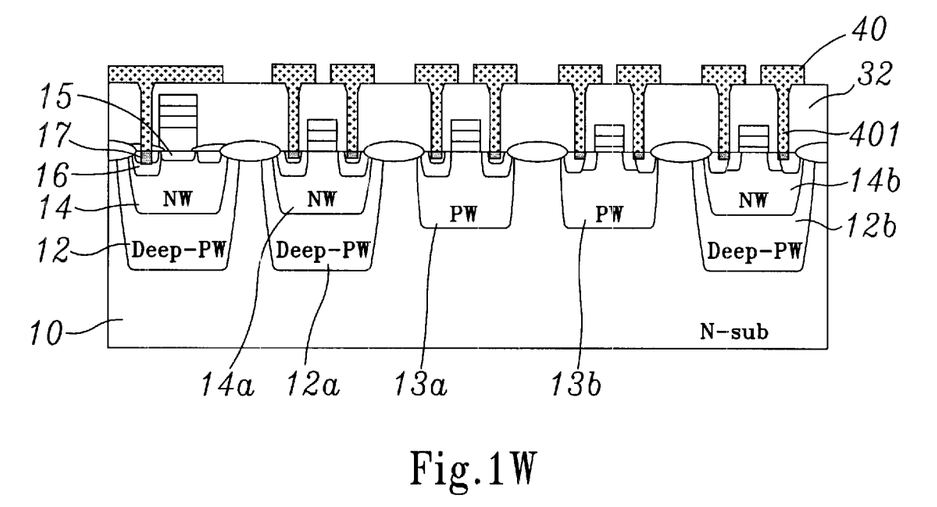
Figure 1X:
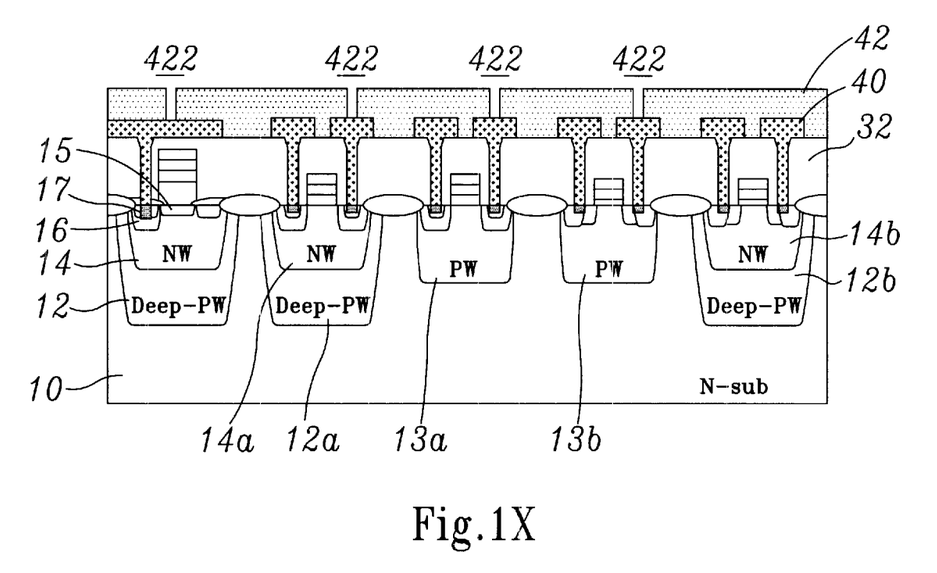
Figure 1Y:
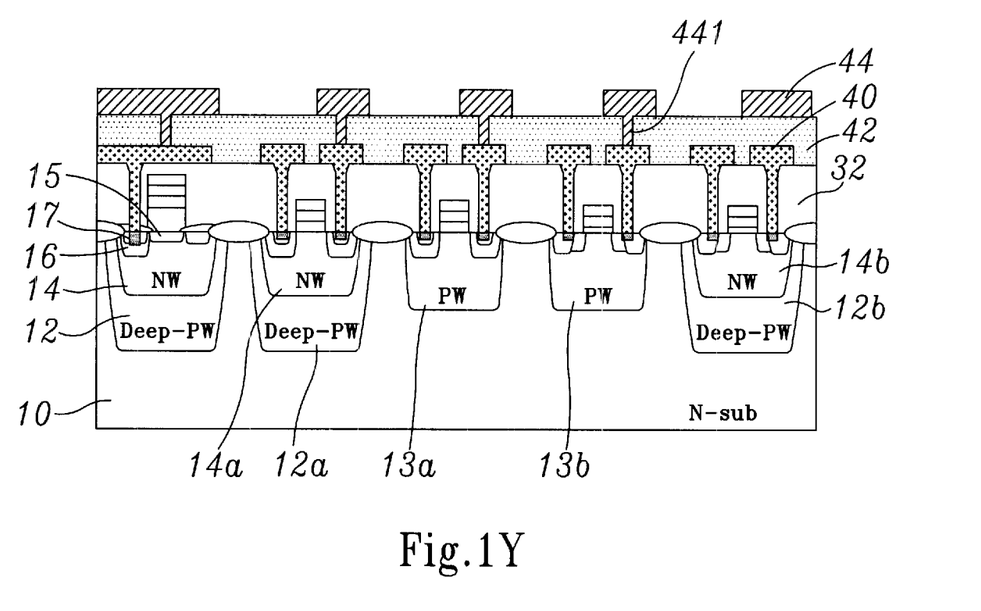
Figure 1Z:
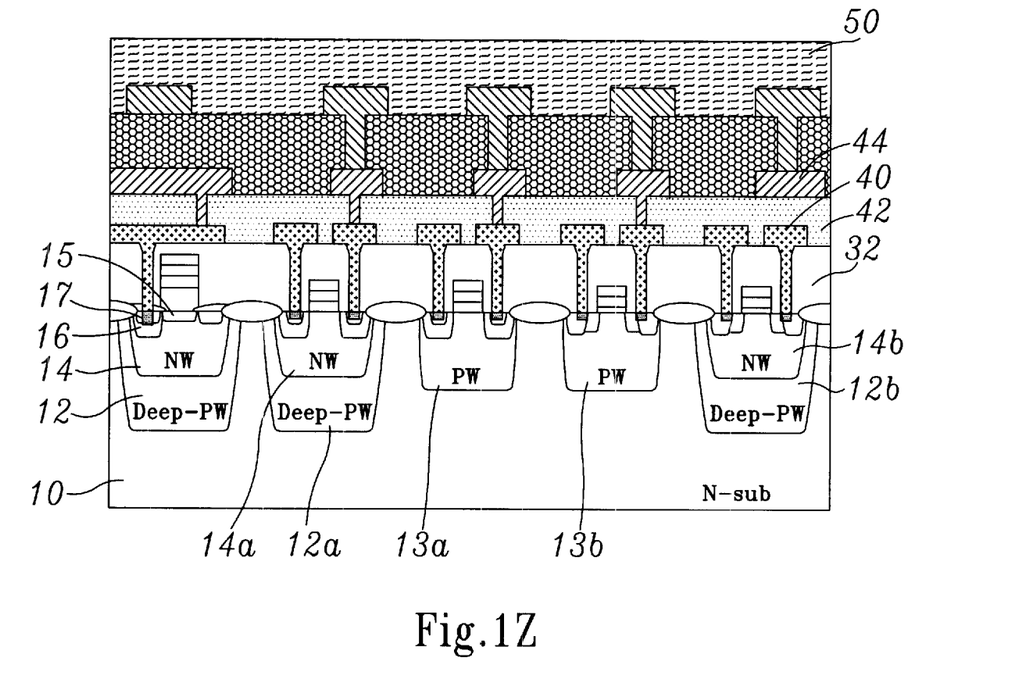
Figure 2:
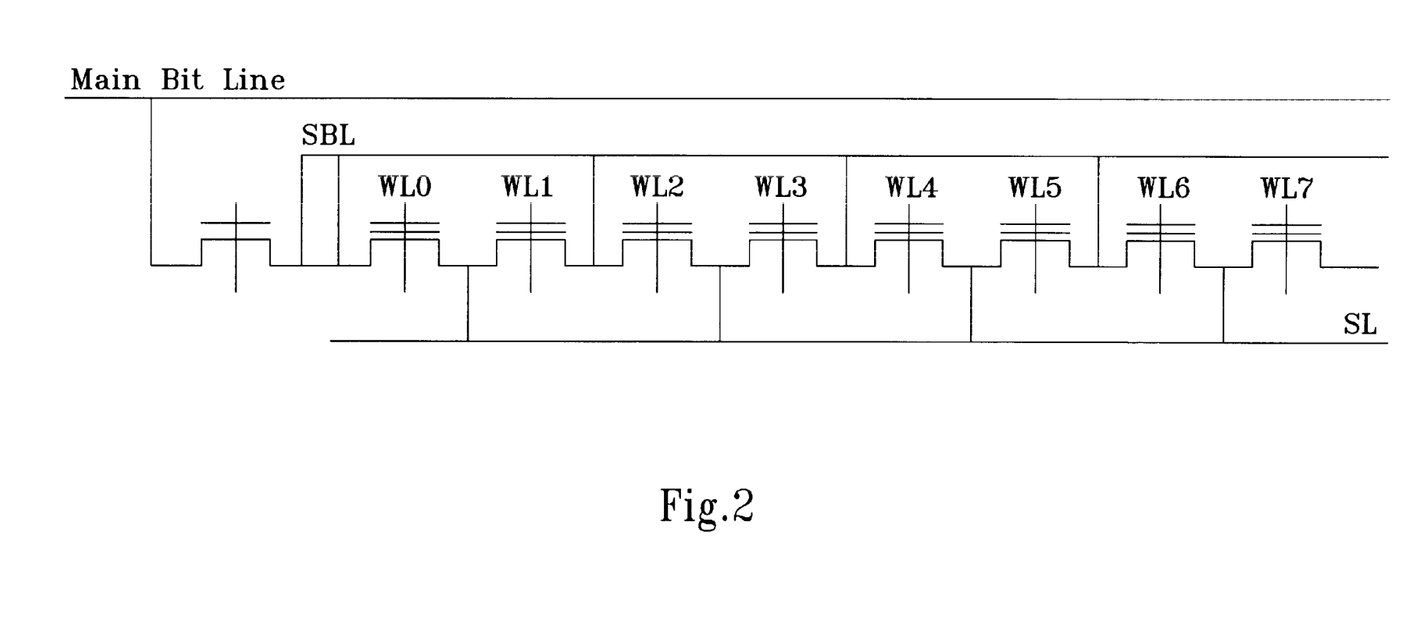
FIG. 2 is a circuit diagram according to a preferred embodiment of the present invention.

Please refer to FIGS. 1A to 1Z, which show the process flow according to a preferred embodiment of the present invention. The process flow comprises the following steps:

Step A: A deep P-well 12 of the flash memory cell, a first deep P-well 12a of the CMOS device, and a second deep P-well 12b of the CMOS device are implanted in proper positions of an N-substrate 10, as shown in FIG. 1A;

Step B: An N-well 14 is implanted in the deep P-well 12 of flash memory cell, a first N-well 14a is implanted in the first deep P-well 12a of the CMOS device, and a second N-well 14b is implanted in the second deep P-well 12b of the CMOS device, as shown in FIG. 1B;

Step C: A first P-well 13a and a second P-well 13b are implanted between the first deep P-well 12a and the second deep P-well 12b of the CMOS device in the N-substrate 10, as shown in FIG. 1C;

Step D: A shallow p-type region 15 is implanted on the surface of the N-well 14 in the deep P-well of the flash memory cell, as shown in FIG. 1D;

Step E: A tunnel oxide layer 20 is grown on the substrate 10, and a first polysilicon layer 22 is deposited, as shown in FIG. 1E;

Step F: The tunnel oxide layer 20 and the first polysilicon layer 22 on the CMOS device are etched, as shown in FIG. 1F;

Step G: An oxide-nitride-oxide (ONO) film 24 is deposited on the first polysilicon layer 22, and the ONO film 24 on the CMOS device is etched, as shown in FIG. 1G;

Step H: A thick oxide layer 25 is grown on the CMOS device, and the thick oxide layer 25 on the second N-well 14b and the second P-well 13b are locally etched, as shown in FIG. 1H;

Step I: A thin oxide layer 26 is grown on the second N-well 14b and the second P-well 13b of the CMOS device, as shown in FIG. 1I;

Step J: A second polysilicon layer 27 and a tungsten silicide 28 are deposited, as shown in FIG. 1J;

Step K: The tunnel oxide layer 20 and all grown and deposited layers on the flash memory cell are etched to form a rectangular stacked layer 30, whose two sides being exposed region of the tunnel oxide layer, and oxidation is performed to form a smiling effect oxide 21 between the rectangular stacked layer 30 and the N-well 14, as shown in FIG. 1K;

Step L: A deep p-type region 16 is implanted at one side of the rectangular stacked layer 30 in the flash memory cell and in the N-well 14, as shown in FIG. 1L;

Step M: N-type regions 17 and 18 are implanted at two sides of the rectangular stacked layer 30 in the flash memory cell, respectively, and in the N-well 14, as shown in FIG. 1M;

Step N: All grown and deposited layers on the CMOS device are etched to respectively form stacked layers 30a, 30b, 30c, and 30d, as shown in FIG. 1N;

Step O: A first lightly doped n-type region 130b is implanted at two sides of the stacked layer 30c on the second P-well 13b of the CMOS device, as shown in FIG. 1O;

Step P: A first lightly doped p-type region 140b is implanted at two sides of the stacked layer 30d on the second N-well 14b of the CMOS device, as shown in FIG. 1P;

Step Q: A second lightly doped n-type region 130a is implanted at two sides of the stacked layer 30b on the second P-well 13a of the CMOS device, as shown in FIG. 1Q;

Step R: A second lightly doped p-type region 140a is implanted at two sides of the stacked layer 30a on the second N-well 14a of the CMOS device, as shown in FIG. 1R;

Step S: An insulating layer is deposited, and side wall spacers 120a and 120b are etched out, a higher doped n-type region 131b is implanted at two sides of the stacked layer 30b on the first P-well 13a of the CMOS device, and a higher doped n-type region 131a is implanted at two sides of the stacked layer 30c on the second P-well 13b of the CMOS device, as shown in FIG. 1S;

Step T: A higher doped p-type region 141b is implanted at two sides of the stacked layer 30a on the first N-well 14a of the CMOS device, and a higher doped p-type region 141a is implanted at two sides of the stacked layer 30d on the second N-well 14b of the CMOS device, as shown in FIG. 1T;

Step U: An insulating layer 32 is formed to cover the rectangular stacked layer 30 and the stacked layers 30a, 30b, 30c, and 30d on the substrate 10, as shown in FIG. 1U;

Step V: Contact holes 33 are etched out at one side of the rectangular stacked layer 30 and two sides of the stacked layers 30a, 30b, 30c, and 30d on the substrate 10 to expose part of the implanted regions. Silicide 34 is deposited in the implanted regions below the contact holes 33. The implanted regions in part of the N-well and P-well are deepened to prevent the deposited silicide 34 from penetrating the junctions, as shown in FIG. 1V;

Step W: A first metal layer 40 is deposited on the insulating layer 32 and locally etched so that each of the contact holes has a first metal interconnect 401 therein, as shown in FIG. 1W;

Step X: A first dielectric layer 42 is deposited on the first metal layer 40, and a plurality of contact vias 422 are etched out, as shown in FIG. 1X;

Step Y: A second metal layer 44 is formed on the first dielectric layer 42 and locally etched so that each of the contact vias 422 has a second metal interconnect 441, as shown in FIG. 1Y; and Step Z: Steps X and Y are repeated till the required level. An encapsulation 50 is finally deposited to cover on the metal layer, as shown in FIG. 1Z.

It is noted that the present invention has low-voltage CMOS devices and high-voltage CMOS devices. The low-voltage CMOS devices are mainly used in logical controllers and encoders, and the high-voltage CMOS devices are mainly used in high-voltage switches, word-line drivers. Therefore, the low-voltage CMOS devices need to meet the requirement of high-speed operation, and the high-voltage CMOS devices need to be capable of bearing a higher breakage voltage. The operating mode of the flash memory cell is shown in Table 1. If the reading operation is performed, the word line voltage is 3.3 V, the bit line voltage is 0V, and the source line voltage is 1V.

TABLE 1

|  | Word line voltage | Bit line voltage | Source line voltage |
| --- | --- | --- | --- |
| Program | −10 V | 5 V | Floating |
| Erase | 10 V | Floating | −8 V |
| Read | 3.3 V | 0 V | 1 V |

To sum up, the present invention relates to a structure of an embedded channel write/erase flash memory cell and a fabricating method thereof and, more particularly, to a structure combining CMOS devices and flash memory cells, which can not only effectively improve the operating efficiency of flash memory cells and CMOS devices, but its whole volume is also smaller than that obtained by combining separately designed and fabricated CMOS devices and flash memory cells.

Although the present invention has been described with reference to the preferred embodiment thereof, it will be understood that the invention is not limited to the details thereof. Various substitutions and modifications have been suggested in the foregoing description, and other will occur to those of ordinary skill in the art. P-type semiconductors and n-type semiconductors can interchange each other in the structure of the present invention. For instance, the N-well/deep P-well/N-substrate structure can be replaced with the P-well/deep N-well/ P-substrate structure. Therefore, all such substitutions and modifications are intended to be embraced within the scope of the invention as defined in the appended claims.

We claim:

1. A fabricating method of an embedded channel write/erase flash memory on an N-substrate, the N-substrate comprising at least a flash memory cell array region, a first complementary metal oxide semiconductor (CMOS) region, and a second CMOS region, which are isolated from one another by isolation layers, the method comprising:

forming a deep P-well in said N-substrate of each of said flash memory cell array region, said first CMOS region, and said second CMOS region;

forming a N-well in each of said deep P-wells;

forming a P-well in said N-substrate of each of said first CMOS region and said second CMOS region;

forming a shallow P-type region on a portion of the surface of said N-well in said flash memory cell array region;

growing a tunnel oxide layer on said N-substrate of said flash memory cell array region, said first CMOS region, and said second CMOS region, and depositing a first polysilicon layer on said tunnel oxide layer;

removing portions of said tunnel oxide layer and said first polysilicon layer, which are positioned in said first CMOS region and in said second CMOS region;

forming an oxide-nitride-oxide (ONO) film on said first polysilicon layer, which is positioned in said flash memory cell array region;

growing a thick oxide layer on said N-well and said P-well of said first CMOS region;

growing a thin oxide layer on said N-well and said P-well of said second CMOS region;

depositing a second polysilicon layer on said ONO film, said thick oxide layer, and said thin oxide layer;

removing portions of said second polysilicon layer, said ONO film, said first polysilicon layer, and said tunnel oxide layer within said flash memory cell region, so as to form a rectangular stacked structure comprising said tunnel oxide layer, said first polysilicon layer, said ONO film, and said second polysilicon layer;

performing an oxidation process to form a smiling effect oxide layer between said rectangular stacked structure and the surface of said N-well in said flash memory cell array region;

forming a deep P-type region in said N-well adjacent to one sidewall of said rectangular stacked structure;

forming two N-type regions in said N-well adjacent to both sidewalls of said rectangular stacked structure;

removing portions of said second polysilicon layer and said thick oxide layer, which are positioned in said first CMOS region, to form a first stacked structure on each of said N-well and said P-well of said first CMOS region, each of said first stacked structures having said second polysilicon layer and said thick oxide layer;

removing portions of said second polysilicon layer and said thin oxide layer, which are positioned in said second CMOS region, to form a second stacked structure on each of said N-well and said P-well of said second CMOS region, each of said second stacked structures having said second polysilicon layer and said thin oxide layer;

forming two first lightly doped N-type regions in said P-well adjacent to both sidewalls of said second stacked structure on said P-well of said second CMOS region;

forming two first lightly doped P-type regions in said N-well adjacent to both sidewalls of said second stacked structure on said N-well of said second CMOS region;

forming two second lightly doped N-type regions in said P-well adjacent to both sidewalls of slid first stacked structure on said P-well of said first CMOS region;

forming two second lightly doped P-type regions in said N-well adjacent to both sidewalls of said first stacked structure on said N-well of said first CMOS region;

depositing a first insulating layer on said flash memory cell array region, said first CMOS region, and said second CMOS region;

etching the first insulating layer so as to form a pair of spacers on both sidewalls of each of said rectangular stacked structure, said first stacked structures, and said second stacked structures;

forming two heavily doped N-type regions in said P-well adjacent to both sidewalls of each of said first stacked structure on the P-well of the first CMOS region and said second stacked structure on the P-well of the second CMOS region;

forming two heavily doped P-type regions in said N-well adjacent to both sidewalls of each of said first stacked structure on said N-well of said first CMOS region and said second stacked structure on said N-well of said second CMOS region;

forming a second insulating layer on said flash memory cell array region, said first CMOS region, and said second CMOS region;

forming a plurality of contact holes beside one sidewall of said rectangular stacked structure and beside both sidewalls of each of said first stacked structures and said second stacked structures; and depositing a first metal layer on said second insulating layer and in each of said contact holes, and locally etching said first metal layer to let each of said contact holes have a first metal interconnect.

2. The fabricating method of an embedded channel write/erase flash memory as claimed in claim 1 further comprising, after said step of depositing a first metal layer on said second insulating layer and then locally etching said first metal layer, the steps of:

(a). depositing a first dielectric layer on said first metal layer and etching out a plurality of contact vias;

(b). forming a second metal layer on said first dielectric layer and locally etching said second metal layer to let each said contact via have a second metal interconnect;

(c). repeating said Steps (a) and (b) till the required level; and (d). depositing an encapsulation layer to cover on a final metal layer.

3. The fabricating method of an embedded channel write/erase flash memory as claimed in claim 1 further comprising, after said step of depositing an oxide-nitride-oxide film on said first polysilicon layer, the step of:

etching part of said oxide-nitride-oxide film, which is positioned in the first CMOS region and in the second CMOS region.

4. The fabricating method of an embedded channel write/erase flash memory as claimed in claim 1 further comprising, after said step of depositing a second polysilicon layer on said ONO film, said thick oxide layer, and said thin oxide layers the step of:

depositing a tungsten silicide layer on said second polysilicon layer.

5. The fabricating method of an embedded channel write/erase flash memory as claimed in claim 1 further comprising, after said step of etching out a plurality of contact holes beside one sidewall of said rectangular stacked structure and beside both sidewalls of each of said first stacked structures and said second stacked structures, the step of:

depositing a silicide layer on a surface of said N-substrate below each of said contact holes.

6. The fabricating method of an embedded channel write/erase flash memory as claimed in claim 5 further comprising, after said step of depositing said silicide layer on the surface of said N-substrate below each of said contact holes, the step of:

deepening said heavily doped N-type region in said P-well and said heavily doped P-type regions in said N-well to prevent said suicide layer from penetrating the junctions of said heavily doped N-type regions and said heavily doped P-type regions.

7. A method of fabricating an embedded channel write/erase flash memory on an N-substrate, the N-substrate comprising at least a flash memory cell array region, a first complementary metal oxide semiconductor (CMOS) region and a second CMOS region, each of the flash memory cell array region, the first CMOS region, and the second CMOS region comprising a deep P-well formed in the N-substrate and an N-well formed in the deep P-well, each of the first CMOS region and the second CMOS region comprising a P-well in the N-substrate, the method comprising:

forming a shallow P-type region in the N-well of the flash memory cell array region;

forming a rectangular stacked structure on the shallow P-type region;

forming a deep P-type region in the N-well adjacent to one sidewall of the rectangular stacked structure;

forming two N-type regions in the N-well adjacent to both sidewalls of the rectangular stacked structure;

forming a first stacked structure and a second stacked structure on the P-well and the N-well of the first CMOS region, and forming a third stacked structure and a fourth stacked structure on the P-well and the N-well of the second CMOS region;

forming two first lightly doped N-type regions in the P-well adjacent to both sidewalls of the third stacked structure;

forming two first lightly doped P-type regions in the N-well adjacent to both sidewalls of the fourth stacked structure;

forming two second lightly doped N-type regions in the P-well adjacent to both sidewalls of the first stacked structure;

forming two second lightly doped P-type regions in the N-well adjacent to both sidewalls of the second stacked structure;

forming a pair of spacers on both sidewalls of each of the rectangular stacked structure, the first stacked structure, the second stacked structure, the third stacked structure, and the fourth stacked structure;

forming two heavily doped N-type regions in the P-well adjacent to both sidewalls of each of the first stacked structure and the third stacked structure; and forming two heavily doped P-type regions in the N-well adjacent to both sidewalls of each of the second stacked structure and the fourth stacked structure.

8. The method of claim 7 wherein the rectangular stacked structure comprises a tunnel oxide layer, a first polysilicon layer, an oxide-nitride-oxide (ONO) film, and a second polysilicon layer.

9. The method of claim 7 wherein a method of forming the rectangular stacked structure comprises:

forming the tunnel oxide layer on the N-substrate of the flash memory cell array region, the first CMOS region, and the second CMOS region;

depositing the first polysilicon layer on the tunnel oxide layer;

removing portions of the tunnel oxide layer and the first polysilicon layer positioned in the first CMOS region and the second CMOS region;

forming the ONO film on the first polysilicon layer, forming the second polysilicon layer on the ONO film; and removing portions of the second polysilicon layer, the ONO film, the first polysilicon layer, and the tunnel oxide layer within the flash memory cell array region, so as to form the rectangular stacked structure on the shallow P-type region.

10. The method of claim 8 wherein after forming the rectangular stacked structure on the shallow P-type region, the method further comprises performing an oxidation process to form a smiling effect oxide layer on the surface of the N-well of the flash memory cell array region.

11. The method of claim 7 wherein each of the first and the second stacked structures comprises a thick oxide layer and a third polysilicon layer.

12. The method of claim 11 wherein each of the third and the fourth stacked structures comprises a thin oxide layer and a fourth polysilicon layer.

13. The method of claim 12 wherein the second polysilicon layer, the third polysilicon layer and the fourth polysilicon layer are formed in a deposition process.

14. The method of claim 13 wherein after the deposition process, the method further comprises depositing a tungsten silicide layer on the second polysilicon layer, the third polysilicon layer and the fourth polysilicon layer.

15. The method of claim 7 wherein after forming the heavily doped P-type regions in the N-well adjacent to both sidewalls of each of the second stacked structure and the fourth stacked structure, the method further comprises:

forming an insulating layer on the flash memory cell array region, the first CMOS region, and the second CMOS region;

forming a plurality of contact holes in the insulating layer, the plurality of contact holes positioned beside one sidewall of the rectangular stacked structure and beside both sidewalls of each of the first, the second, the third, and the fourth stacked structures; and depositing a first metal layer on the insulating layer and in each of the contact holes, and locally etching the first metal layer to let each of the contact holes have a first metal interconnect.

16. The method of claim 15 wherein after forming the contact holes beside one sidewall of the rectangular stacked structure and beside both sidewalls of each of the stacked structures, the method further comprises depositing a silicide layer on a surface of the N-substrate below each of the contact holes.

17. The method of claim 16 wherein after depositing the silicide layer on a surface of the N-substrate below each of the contact holes, the method further comprises penetrating a junction between the N-type region in the deep P-type region and the deep P-type region by the silicide layer.

18. The method of claim 16 wherein after depositing the silicide layer on a surface of the N-substrate below each of the contact holes, the method further comprises deepening the heavily doped N-type regions and the heavily doped P-type regions to prevent the junctions of the heavily doped N-type regions and the heavily doped P-type regions from being penetrated by the silicide layer.

19. The method of claim 7 wherein the first CMOS region is used for fabricating CMOS devices, functioning as high-voltage switches and word-line drivers capable of bearing a higher breakage voltage.

20. The method of claim 7 wherein the second CMOS region is used for fabricating CMOS devices, functioning as logical controllers and encoders.

* * * * *